United States Patent [19]

Brooks

[11] 4,016,433
[45] Apr. 5, 1977

[54] GTO CIRCUITS

[75] Inventor: Ronald Robert Brooks, Hamilton Square, N.J.

[73] Assignee: RCA Corporation, New York, N.Y.

[22] Filed: Jan. 23, 1976

[21] Appl. No.: 651,798

[52] U.S. Cl. .................. 307/252 C; 123/148 E; 123/179 BG; 307/305; 315/209 SC
[51] Int. Cl.² .................. H03K 17/72; F02P 1/00
[58] Field of Search ....... 307/252 R, 252 A, 252 C, 307/252 J, 305; 331/111; 123/179 BG, 148 E, 148 D; 315/209 CD, 209 SL

[56] References Cited
UNITED STATES PATENTS

| 3,308,800 | 3/1967 | Motto, Jr. et al. | 307/252 C |
| 3,348,118 | 10/1967 | Watrous | 307/252 C |

Primary Examiner—John Zazworsky
Attorney, Agent, or Firm—Harold Christoffersen; Samuel Cohen; Kenneth Watov

[57] ABSTRACT

The current through the main conduction path of a gate-turn-off silicon controlled rectifier (GTO) charges a capacitor in the cathode circuit of the rectifier. The GTO is turned off by providing a discharge path for the capacitor via the cathode-to-gate electrode of the GTO. A diode in the charging path of the capacitor becomes back-biased during discharge of the capacitor, thereby preventing the load in the cathode circuit of the rectifier from bypassing any of the discharge current.

10 Claims, 5 Drawing Figures

GTO CIRCUITS

The present invention relates generally to switching circuits, and more specifically to switching circuits for a gate-turn-off silicon controlled rectifier.

A gate-turn-off silicon controlled rectifier (hereinafter referred to as a GTO), is a solid-state switching device having a main current conduction path between anode and cathode electrodes, and a gate electrode to which control signals may be applied for turning the GTO on and off. An appropriate value of position voltage applied to the gate electrode of the GTO will cause a current to flow from the gate electrode to the cathode electrode of the GTO, turning it on. An appropriate value of negative voltage applied to the gate electrode will cause current to flow from the cathode electrode to the gate electrode of the device, turning it off. Other methods of turn off for a GTO may include removal of the anode voltage, or current starving the GTO by shunting current away from the anode electrode of the device.

Figure 1:
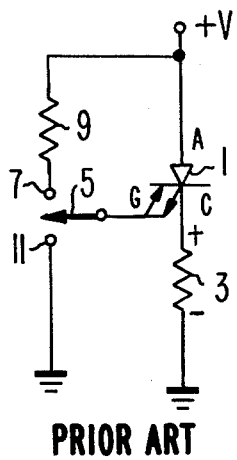
FIG. 1 is a circuit schematic diagram of a prior art switching circuit including a gate-turn-off silicon controlled rectifier.
Figure 2:
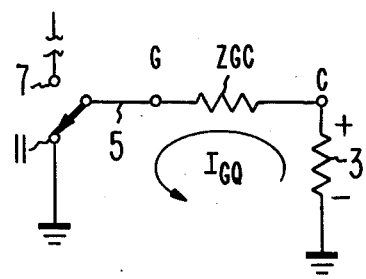
FIG. 2 is an equivalent circuit diagram of the circuit of FIG. 1, illustrating the turn off current flow $I_{GQ}$ and related impedances.

In FIG. 1, for example, a switching circuit including a GTO 1 having a cathode load 3, is turned on by moving the pole of switch 5 to upper contact 7. In this position of the switch 5, the gate electrode is connected via resistor 9 to the positive voltage +V, causing the gate-cathode junction of the GTO to be forward-biased and current to flow from the gate to the cathode electrode, turning on the GTO 1. When the GTO 1 so turns on, the impedance between its anode and cathode electrodes, forming the main conduction path, decreases to a relatively low value, permitting current to flow from the positive voltage supply +V to the load 3 via said conduction path. This flow of current causes the voltage drop across the load 3 to be positive with respect to ground, as shown. To turn off the GTO, the pole of switch 5 is moved from contact 7 to contact 11, thereby connecting the gate electrode of the GTO 1 to ground. At the instant of switching the pole to contact 11, a portion of a current flowing in the main conduction path of the GTO 1 is diverted via the gate electrode to ground. This reduction in anode-to-cathode current flow tends to start the turn-off action. At the same time, the voltage still present across the load 3 is in a sense to tend to cause a current $I_{GQ}$ to flow in the reverse direction through the cathode-to-gate electrode path ($Z_{GC}$), as indicated in FIG. 2. This is current flow through the cathode-gate path in the turn off direction and it completes the turn-off action, cutting off the GTO 1.

In one practical circuit such as discussed above, if the initial current is less than about 15 amperes, the GTO 1 will turn off when pole 5 switches to contact 11. In other words, the reverse current $I_{GQ}$ developed is sufficient to extinguish the GTO anode-to-cathode current. However, if the initial load current is greater than about 15 amperes, the circuit of FIG. 1 will not reliably turn off the GTO 1. The reason is that the positive voltage +V is a constant voltage source and the sum of the impedances $R_3+Z_{GC}$ ($R_3$ is the impedance of load 3, and $Z_{GC}$ is the gate-cathode impedance) limits the reverse current $I_{GQ}$ to a value equal to $[V_3/(R_3+Z_{GC})]$, where $V_3$ is the voltage across the load 3. Regardless of the value of $R_3$, $V_3$ will always be about 1 volt less than +V (assuming the forward voltage drop across the anode-cathode junction of GTO 1 is about 1 volt). This limits $I_{GQ}$ to a value such that for load currents greater than about 15 amperes, the GTO 1 cannot be turned off. Also, $Z_{GC}$ is non-linear, increasing as the load or anode-cathode current decreases or as the GTO 1 begins to turn-off. As $I_{GQ}$ begins to flow, GTO 1 begins to turn off with $Z_{GC}$ increasing in value. As $Z_{GC}$ increases in value, $I_{GQ}$ decreases accordingly, causing $V_3$ rapidly to decrease ($V_3=I_{GQ}R_3$ at this time), further limiting reliable turn-off of the GTO 1 for relatively high load currents. If $V_3$ could be otherwise held at a higher value for longer periods of time during the flow of $I_{GQ}$, and made less dependent upon the magnitude of $I_{GQ}$, then GTO 1 could be turned off from values of load current substantially greater than about 15 amperes.

Figure 3:
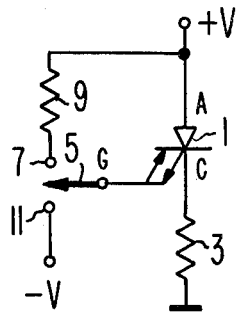
FIG. 3 is a circuit schematic diagram of another embodiment of a prior art switching circuit including a gate-turn-off silicon controlled rectifier.

One way of improving the reliability of the FIG. 1 circuit is to return the gate electrode to a negative source of voltage, as shown in FIG. 3. However, the requirement for an additional voltage supply −V may be costly and undesirable in many applications, such as automotive electronics, for example.

U.S. Pat. No. 3,271,700 to Gutzwiller suggests a capacitor in the cathode circuit of a GTO which charges when the GTO is "on," and which tends to discharge through the cathode-to-gate circuit of the GTO to assist in turning off the GTO, when a turn-off signal is applied to the gate of the GTO. However, this capacitor is connected across the cathode load, which accepts a portion of the capacitor discharge current. This reduces the effectiveness of the turn-off action, especially where the load impedance is relatively low. Also, Gutzwiller suggests the addition of another capacitor in parallel with a resistor in the gate circuit to provide a momentary low impedance path to −DC shunting this resistor, at turn-off. The use of this second capacitor tends to reduce the peak $I_{GQ}$ available from the charged cathode circuit capacitor for turn-off, due to the voltage divider action between the two capacitors and the shunting action of the resistor in the gate circuit. The capacitor in the cathode circuit also will completely discharge through the load upon turn-off of the GTO, reducing transient protection of this circuit.

Figure 4:
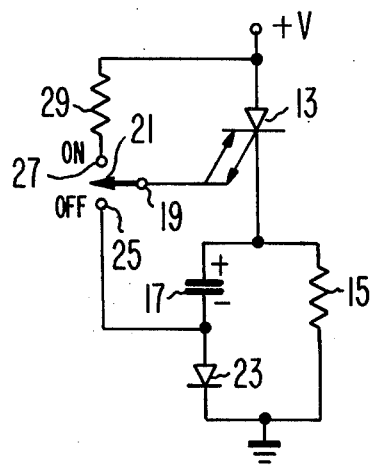
FIG. 4 is a schematic diagram of a circuit embodying the present invention.

The switching circuit of FIG. 4, which embodies the invention, includes a GTO 13 having an anode electrode connected to a positive source of voltage +V, a cathode electrode connected to the common connection of a load 15 and a capacitor 17, and a gate electrode connected to the pole 19 of a switch 21. The other terminal of load 15 and the cathode electrode of a diode 23 are connected in common to a point of reference potential, ground in this example. The anode electrode of the diode 23 is connected in common to the other terminal of the capacitor 17, and the lower contact 25 of the switch 21. The upper contact 27 of the switch 21 is connected via a resistor 29 to the positive voltage supply +V.

To turn on GTO 13, the pole 19 of switch 21 is moved to the upper contact 27, whereby +V is applied to the gate electrode of GTO 13 via resistor 29. This forward-biases the gate-cathode junction of GTO 13, causing the GTO 13 to turn on, that is, the resistance of its main conduction path switches from a relatively high resistance to a relatively low resistance. This permits current to flow from the positive supply +V through this main conduction path, through load 15 to ground. Current also flows through the path in parallel with load 15, namely the series connected capacitor 17 and diode 23 until capacitor 17 becomes fully charged. The voltage across the capacitor, when fully charged, is equal to $+V-(V_{CA}+V_T)$, where $V_{CA}$ is the anode-to-cathode voltage of the GTO 13 and $V_T$ the forward voltage across diode 23, when it conducts. In practice $V_{CA}+V_T$ may equal roughly one volt or so. When the capacitor 17 has fully charged, current flow through it and diode 23 ceases, the full anode-to-cathode GTO current flowing through the load 15.

After the GTO has been turned on by the application of a positive voltage to its gate electrode, the positive voltage can be removed and the GTO 13 will remain in a conductive or "on" state. Accordingly, once GTO 13 has been turned on, the pole 19 of switch 21 can be returned to a neutral position, without affecting the conduction of GTO 13.

To turn off GTO 13, the pole 19 of switch 21 is switched to the contact 25. A portion of the anode-to-cathode current momentarily is diverted to the path comprising the gate electrode of the GTO in series with diode 23. The corresponding decrease in the anode-to-cathode current tends to initiate the turn off of the GTO. The capacitor 17 is charged in the polarity indicated at this time. This polarity is such as to reverse-bias diode 23 so that the capacitor cannot discharge through load 15 (this is important, as explained below). This capacitor 17 instead discharges through the path comprising the cathode-to-gate electrode of the GTO 13, reverse-biasing the cathode-to-gate electrode junction. Initially, the discharge of capacitor 17 is at a relatively high current level, for the junction resistance is low at this time. As contrasted to the circuit of FIG. 1 where the load impedance $R_3$ limits the reverse current flow $I_{GQ}$, here the capacitor 17 operates as the voltage source and its internal impedance, which is very low, does not limit the flow of $I_{GQ}$ to any significant extent. Also, the voltage across capacitor 17 is maintained at a relatively higher level, for a given period of flow $I_{GQ}$, as contrasted to the rapid reduction in voltage $V_3$ in the circuit of FIG. 1. As the GTO 13 begins to turn off because of this flow of discharge current, the non-linear impedance $Z_{GC}$ of the gate-cathode junction rapidly increases, reducing the rate of discharge of capacitor 17, until the GTO 13 turns off.

One important feature is that if the capacitor 17 has not fully discharged when the GTO 13 turns off, which is generally the case, the remaining charge upon capacitor 17 will act to continuously back-bias the gate-cathode junction of GTO 13, thereby providing a degree of transient protection to insure that the GTO 13 remains turned off. However, in normal operation, this charge is insufficient to prevent turn-on of the GTO 13, when switch 21 again is thrown to the "on" position. In other words, +V is so much larger than any residual voltage remaining across capacitor 17, that when the switch 21 is turned "on," forward current flows through the gate-to-cathode junction, causing anode-to-cathode current flow through the main conduction path of the GTO 13.

Another important feature of the circuit is the diode 23. As already mentioned, it becomes back-biased during discharge of capacitor 17. This prevents any of the discharge current from being diverted to the load 15. In other words, this full discharge current is available to aid in the turn off of the GTO and this insures quick turn off especially in cases where the load impedance may be relatively low.

In one particular circuit, the addition of the capacitor 17 and the diode 23 has been found to provide reliable turn off of GTO 13 for anode-cathode or load currents having magnitudes well in excess of 15 amperes. Further, it permits reliable high-current operation of a GTO from a single polarity supply.

Figure 5:
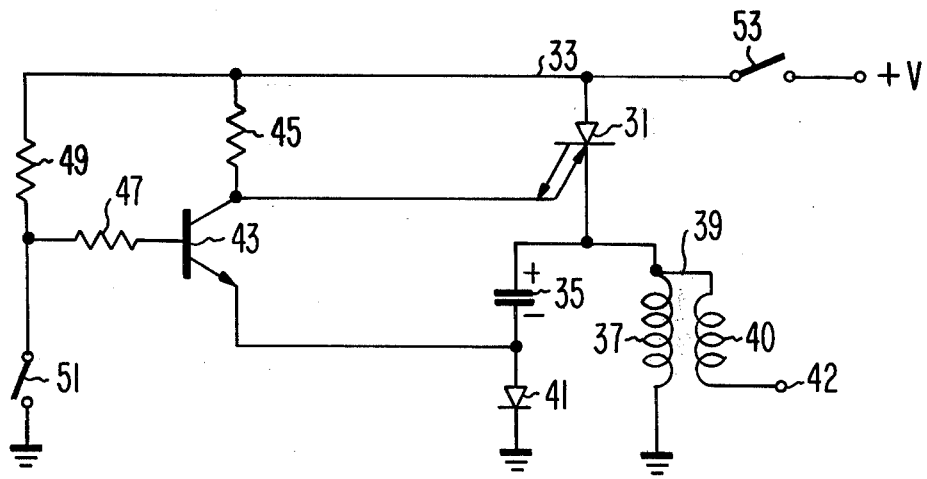
FIG. 5 is a circuit schematic diagram of an automotive ignition system including the present invention.

FIG. 5 illustrates an embodiment of the present invention in which the load includes a coil which may be in an automotive ignition system. The circuit includes a GTO 31 having an anode electrode connected to a positive bus 33, and a cathode electrode connected in common to one terminal of both a capacitor 35 and the primary winding 37 of an ignition coil 39. The other terminal of the capacitor 35 is connected in common to the anode electrode of the diode 41 and the emitter electrode of a transistor 43. The cathode electrode of the diode 41 and the other terminal of the primary winding 37 are connected to ground. The transistor 43 also has a collector electrode connected to the gate electrode of the GTO 31, and via a resistor 45 to the positive bus 33, and a base electrode connected via series-connected resistors 47 and 49 to the positive bus 33. The common connection of the resistors 49 and 47 is connected to one terminal of a set of points 51, the other terminal of the points 51 being connected to ground. The positive bus 33 is connected to one terminal of a switch 53, the other terminal of the switch 53 being connected to the positive voltage supply +V. The ignition coil 39 has a secondary winding for producing a high-voltage spark at an output terminal 42. The elements 43, 47, 49, 45, driven by the set of points 51, comprise an electronic switch which is functionally analogous to the switch 21 and resistor 29 of the switching circuit of FIG. 4. Also, the cathode load represented by the primary winding 37 of ignition coil 39 in the ignition system, is analogous to the cathode load 15 of FIG. 4.

Operation of the ignition system is initiated by closure of the ignition switch contacts 53 to apply the positive voltage +V to the positive bus 33. As the engine is cranked and also when running, the set of points 51 alternately will open and close. Each time the points 51 close, transistor 43 is turned off. The positive voltage +V applied to the gate electrode of GTO 31 via resistor 45, turns on the GTO 31. This permits current to flow from the bus 33 through the main conduction path of the GTO 31 and the primary winding 37 of ignition coil 39 at the same time capacitor 35 charges in the same manner as in FIG. 4.

Each time the points 51 open, a positive voltage +V is applied to the base electrode of transistor 43 via resistors 47 and 49, turning on transistor 43. When transistor 43 turns on, it connects the gate electrode of the GTO to ground via collector-emitter path and diode 41. As in the operation of the circuit of FIG. 4, at the instant the transistor 43 is turned on, a portion of the current flowing from the anode to cathode electrode of GTO 31 is diverted to ground via the gate electrode of the GTO, initiating the turn off of the GTO. Thereafter, the gate electrode of GTO 31 will be clamped to a voltage above ground equal to the sum of the voltage drops across the collector-emitter electrodes of transistor 43, and the anode-cathode electrodes of diode 41 (one diode drop of about 0.6 volts).

The operation of capacitor 35 is analogous to that of capacitor 17 in FIG. 4. It cannot discharge through load 37 but does discharge through the path comprising the cathode-to-gate electrode path of the GTO and the collector-to-emitter path of transistor 43, reverse-biasing the cathode-to-gate junction in the process. As in the FIG. 4 circuit, the initial discharge is at a relatively high current level and then as the GTO 31 begins to turn off, at a lower level. In normal operation, as with the capacitor 17 of the circuit of FIG. 4, the capacitor 35 will retain a portion of its charge or not be fully discharged in turning off GTO 31. As noted for the circuit of FIG. 4, this remaining charge on capacitor 35 will continue to backbias the gate cathode junction of GTO 31, providing transient protection or helping to prevent a positive transient at the gate electrode from turning the GTO 31 back on.

When the GTO 31 turns off, the energy stored in the primary winding 37 is transferred inductively from the primary winding 37 to the secondary winding 40, producing a very high voltage in the secondary winding 40. This secondary voltage is provided at output terminal 42 for firing a spark plug (not shown) connected to the output terminal 42.

The ignition system of FIG. 5, in providing a primary winding 37 as a cathode load, offers certain advantages over other ignition system which include the primary winding of the ignition coil 39 as an anode load for a GTO switch. For example, in an ignition system operated with the primary winding of the ignition coil as an anode load, if the system is operated without coupling spark plugs to the output terminal of the secondary winding of the ignition coil, when the GTO is turned off, the inductive kickback from the primary winding may be as high as 1,200 volts, and may burn out the solid-state switching device, such as a GTO, for example. Such burnout may result from the kickback voltage having a value in excess of the forward blocking capability of the device. To avoid destruction of the GTO's in such anode-loaded ignition systems, a zener diode is connected from the anode electrode to ground, to reduce the magnitude of this reflected voltage to a safe level, via the clamping action of the zener diode. In the ignition system of FIG. 5, such zener protection is not required for protecting the GTO 31, from the reflected voltage from the primary winding resulting from an unloaded secondary winding. The reason that such protection is not required is twofold. First, the reflected voltage from the primary winding is substantially reduced by the shunting action of the capacitor 35 in series with diode 41 across the primary winding 37. In other words, if the secondary winding is unloaded when the GTO 31 is turned off, the inductive kickback or reflected voltage from the primary winding 37 will be shunted to ground by the conduction path including capacitor 35 and diode 41. It is thought that the circuit including the cathode-gate path of GTO 31, the collector-emitter path of transistor 43, and the anode-cathode path of diode 41 also acts as a shunt path for the reflected voltage; however, this shunting action is not yet fully understood. Second, and most important, with the primary acting as a cathode load, the reflected voltage is of such polarity to back-bias the anode-cathode junction of the GTO 31, thereby maintaining the GTO 31 in a non-conductive condition. Accordingly, a switching device having a lower forward blocking capability or rating may be used to make the circuit of FIG. 5 more economical, as compared to the circuit having the primary winding connected as an anode load.

What is claimed is:

1. A switching circuit comprising:
    first and second terminals across which a direct operating potential may be applied;
    load means;
    a gate-turn-off silicon controlled rectifier having an anode electrode connected to said first terminal, a cathode electrode connected via said load means to said second terminal, and a gate electrode;
    charge storage means connected at one terminal to said cathode electrode and coupled at its other terminal to said second terminal responsive to current flow through said rectifier for accumulating a charge;
    means coupled to said gate electrode of said rectifier for supplying a voltage thereto during one period of time for turning said rectifier on, and for connecting said gate electrode to said other terminal of said charge storage means during a second period of time for thereby permitting said charge storage means to discharge through a conduction path between said cathode-gate electrodes, for turning said rectifier off; and
    isolating means connected between the other terminal of said charge storage means and said second terminal for substantially preventing any discharge current from flowing through said load means.

2. The switching circuit of claim 1, wherein said charge storage means comprises a capacitor; and wherein said isolating means comprises diode means, said diode means being connected between said other terminal of said capacitor and said second terminal, and being poled in a direction to conduct the anode-to-cathode current of said rectifier.

3. The switching circuit of claim 1, wherein said means coupled to said gate electrode includes:
    resistive means; and
    a single-pole-double-throw switch having a pole connected to the gate electrode of said rectifier, one contact coupled via said resistive means to said first terminal, and another contact connected to said other terminal of said charge storage means.

4. The switching circuit of claim 1, wherein said load means comprises an ignition coil having a primary winding between said cathode and said second terminal, and a secondary winding coupled to said primary winding.

5. The switching circuit of claim 4, wherein said means coupled to said gate electrode includes:
    a transistor having a base electrode, a collector electrode connected to said gate electrode of said rectifier, an emitter electrode connected to the common connection of said charge storage means and said isolating means, and a base electrode;
    resistive means connected between said first terminal and the collector electrode of said transistor; and
    means including a set of points connected between said first and second terminals, for alternately connecting the base electrode of said transistor to said first and then second terminals, for cyclically turning said transistor on and off, respectively, thereby turning said rectifier off and on, respectively.

6. A method for ensuring turn-off of a gate-turn-off silicon controlled rectifier having gate, anode, and cathode electrodes, a load connected between the cathode electrode and a point of reference potential, and a direct operating voltage applied to said anode electrode, comprising the steps of:

applying a voltage in the forward direction between the gate and cathode electrodes of said rectifier to turn it on;

developing a potential across said load in response to the flow of anode-to-cathode current through said rectifier, when it is turned on;

applying the potential across said load to a capacitor for causing the capacitor to accumulate a charge thereupon;

removing said forward voltage; and discharging the accumulated charge from said capacitor through gate electrode-to-cathode circuit of said rectifier in the reverse direction, for turning said rectifier off, while preventing the discharge current from passing through said load.

7. In combination:

a gate-turn-off silicon controlled rectifier having anode, cathode, and gate electrodes, connected at its anode electrode to a terminal for an operating voltage;

means for applying a voltage in the forward direction between said cathode and gate electrode for initiating a flow of current through anode-to-cathode path of said rectifier;

load means receptive of said current connected between said cathode and a point of reference potential;

charge storage means connected at a first terminal to said cathode and coupled at a second terminal to said point of reference potential for accumulating a charge in response to said current flow;

means for effectively removing said forward voltage;

means for providing a discharge circuit, via the cathode-to-gate electrode path of said rectifier, for said charge storage means, for thereby causing discharge current to flow in the reverse direction through said cathode-to-gate electrode path; and isolating means connected between said second terminal of said charge storage means and said point of reference potential for preventing said discharge current from flowing through said load means.

8. The combination of claim 7, wherein said charge storage means includes a capacitor connected between said cathode electrode and said isolating means.

9. The combination of claim 7, wherein said isolating means includes unidirectional current means poled in a direction to conduct the anode-to-cathode current of said rectifier.

10. The combination of claim 7, wherein said load means includes an ignition coil having a primary winding connected as said load means.

* * * * *